United States Patent [19]
McGrew

[11] Patent Number: 5,521,030
[45] Date of Patent: May 28, 1996

[54] PROCESS FOR MAKING HOLOGRAPHIC EMBOSSING TOOLS

[76] Inventor: Stephen P. McGrew, 214 Jeter St., Santa Cruz, Calif. 95060

[21] Appl. No.: 469,432

[22] Filed: Jun. 6, 1995

Related U.S. Application Data

[63] Continuation of Ser. No. 129,543, Sep. 28, 1993, abandoned, which is a continuation of Ser. No. 556,164, Jul. 20, 1990, abandoned.

[51] Int. Cl.⁶ .................................................. G03H 1/02
[52] U.S. Cl. ........................... 430/1; 430/2; 430/323; 430/320; 430/325; 216/9; 216/41; 216/65; 216/66; 216/92; 216/94; 204/192.34
[58] Field of Search ........................... 430/1, 2, 323, 430/320, 325, 945; 204/298.35, 298.36, 298.04, 298.25, 298.28, 192.34; 216/8, 9, 11, 41, 44, 58, 65, 66, 74, 75, 84, 92, 94, 96, 100; 219/121.19, 121.68; 29/23.1, 893.33

[56] References Cited

U.S. PATENT DOCUMENTS

| | | | |
|---|---|---|---|
| 3,048,512 | 8/1962 | Nelson | 156/640 |
| 3,244,094 | 4/1966 | Gresham | 156/639 |
| 3,610,143 | 10/1971 | Greenwood et al. | 204/11 |
| 3,647,289 | 3/1972 | Weber | 359/1 |
| 3,656,827 | 4/1972 | Gamblin et al. | |
| 3,733,258 | 5/1973 | Hanak et al. | 204/192.32 |
| 3,875,026 | 4/1975 | Widmer | 204/192.26 |
| 3,944,420 | 3/1976 | Gale et al. | 430/323 |
| 4,056,395 | 11/1977 | Sato et al. | 156/643 |
| 4,206,965 | 6/1980 | McGrew | |
| 4,446,197 | 5/1984 | Benko | 428/625 |
| 4,514,479 | 4/1985 | Ferrante | 430/323 |
| 4,629,282 | 12/1986 | McGrew | 359/1 |
| 4,731,155 | 3/1988 | Napoli et al. | 156/643 |
| 4,878,995 | 11/1989 | Arikado et al. | 156/643 |
| 4,888,260 | 12/1989 | Cowan | 430/2 |

(List continued on next page.)

FOREIGN PATENT DOCUMENTS

| | | | |
|---|---|---|---|
| 0365031 | 4/1990 | European Pat. Off. . | |
| 58-144880 | 8/1983 | Japan | 359/12 |
| 60-124827 | 7/1985 | Japan | 156/639 |
| 61-243174 | 10/1986 | Japan | 204/298.36 |
| 62-222282 | 9/1987 | Japan | 430/2 |
| 1161302 | 6/1989 | Japan . | |
| 1-161302 | 6/1989 | Japan | 430/2 |
| 1-202821 | 8/1989 | Japan . | |
| 1508660 | 4/1978 | United Kingdom . | |
| WO89/12261 | 12/1989 | WIPO . | |

OTHER PUBLICATIONS

63-138542 Kano et al. (Abstract only).
Spencer et al. "Ion Beam Techniques for Device Fabrication" J. Vac. Sci. & Tech. 8 S52–S70.

*Primary Examiner*—Martin J. Angebranndt
*Attorney, Agent, or Firm*—Seed and Berry

[57] ABSTRACT

A method for producing durable embossing tools is disclosed. An anisotropic etching process, such as ion etching, is used to etch a relief pattern into a hard substrate. A transfer layer is formed overlaying a generally smooth, seamless surface region of a substrate. A desired relief pattern is formed in the transfer layer, by exposing a photoresist, embossing, or the like. The substrate having the photoresist thereon is subjected to an anisotropic etch. The anisotropic etch continues until the transfer layer is completely removed and the relief pattern is formed in the upper surface of the embossing tool. The relative etch rates between the transfer layer and the surface region of the embossing tool are selected to provide the desired depth modulation in the surface of the embossing tool. An embossing tool produced according to the invention has a relatively hard surface and may thus be used for the mass production of holographic images without significant degradation of the pattern. Because the embossing tool can be made from an extremely hard material such as chromium or hardened steel, materials which previously could not be economically embossed with holograms, such as aluminum or steel, may now be embossed by an embossing tool made according to this invention.

15 Claims, 5 Drawing Sheets

U.S. PATENT DOCUMENTS

| | | | |
|---|---|---|---|
| 4,913,585 | 4/1990 | Miekka et al. | 264/1.7 |
| 4,913,858 | 4/1990 | Miekka et al. | 264/1.7 |
| 4,923,572 | 5/1990 | Watkins et al. | 204/6 |
| 5,004,673 | 4/1991 | Vlannes | 430/323 |
| 5,055,696 | 10/1991 | Haraichi et al. | 250/497.2 |
| 5,059,499 | 10/1991 | Teitel | 430/323 |
| 5,147,763 | 9/1992 | Kamitakahara | 430/323 |

PROCESS FOR MAKING HOLOGRAPHIC EMBOSSING TOOLS

CROSS-REFERENCE TO RELATED APPLICATIONS

This application is a continuation of U.S. patent application Ser. No. 08/129,543, filed Sep. 28, 1993, now abandoned; which application is a continuation of U.S. patent application Ser. No. 07/556,164, filed Jul. 20, 1990, now abandoned.

TECHNICAL FIELD

This invention relates to a method and an apparatus for producing ion-milled embossing tools, and more particularly, to providing an ion-milled embossing tool for imprinting holograms.

BACKGROUND OF THE INVENTION

Mass producing holograms using embossing tools is known in the prior art. Many charge cards, such as VISA®, MasterCard®, and the like, include an embossed hologram on the card. Embossed holograms are produced in the prior art by impressing a translucent film with an embossing die having a hologram relief pattern.

A hologram embossing die is produced in the prior art using a series of steps. First, a photoresist coated plate is exposed to a holographic interference pattern. The photoresist is then developed to form a surface-relief pattern in the photoresist corresponding to the exposure pattern. A thin layer of nickel is electroformed onto the relief surface of the photoresist. The nickel electroform is then peeled from the photoresist and clamped to a substrate, either by being wrapped around a cylinder or being clamped to a flat block, thus creating the die. A transparent film is then stamped with the metal die, impressing the hologram relief pattern into the film and creating the hologram. (For purposes of this specification, the term hologram is used in the broad sense to include translucent films viewed through laser light, diffraction patterns, "2D3D" holograms, and the other patterns in the broad category of holograms and diffractive patterns.)

The production of embossed holographic pictures using techniques of the prior art has numerous disadvantages. Presently, nickel is the preferred metal for a hologram die. Only material that is softer than the metal of the die can be imprinted by the die. For example, nickel is able to imprint polyester films, some types of plastic, or the like. However, nickel deforms after continued use so that after a few thousand feet of embossing it is no longer usable. A further disadvantage is that when the die is wrapped around a cylinder, a seam runs parallel to the axis of the cylinder. A hologram pattern cannot be printed on or near such a seam. While it is of course possible to electroform other metals than nickel, the problem remains that a solid cylindrical roller cannot be made by a deposition process such as electroplating. Also, nickel is not a suitable material for high-impact processes such as coining for a number of reasons. The master die, which is generally made of nickel, must be firmly clamped to a die block. Because the nickel is relatively soft, it is deformed when clamped to the substrate. In addition, the nickel is not harder than other metals that one may wish to stamp.

The use of chemical etching to transfer photoresist patterns into embossing rollers and dies is known in the prior art. U.S. Pat. No. 3,944,420, to Gale et al., describes a technique for producing an aluminum die for hologram embossing. However, the Gale et al. process is severely limited by the isotropy of this chemical etching process so that the fidelity of the etched pattern degrades rapidly with increasing etch depth. Further, aluminum cannot withstand for long the extremely high pressures present in hologram embossing presses and thus is not suitable for use as a die. Consequently, truly durable metal dies for hologram embossing have not been produced by chemical etching.

Ion milling, reactive-ion etching, and related processes have been practiced in the semiconductor industry. Various ion-milling techniques are used to selectively produce relief patterns in silicon or other semiconductor substrates, as is well known in the microelectronics art. Ion milling has been used to alter the shape of surface-relief holograms recorded in photoresist by taking advantage of the dependence of etch rate on the angle of incidence. For example, sinusoidal relief holograms have been converted to holograms having a sawtooth groove profile by ion milling at appropriate angles to the surface. Reactive-ion etching has been used to etch an interferometrically recorded diffraction grating into the surface of an optical fiber to produce an optical element in the fiber, as described in *Laser Focus/Electro-Optics*, October 1986, page 74.

SUMMARY OF THE INVENTION

It is therefore an object of this invention to provide a hologram embossing die from a durable material such as tool steel or diamond.

It is a further object of this invention to provide a method of forming a seamless holographic die pattern in a hard, seamless substrate such as a stainless steel cylinder.

It is a further object of this invention to provide molds having a hologram therein for injection molding a holographic pattern.

It is a further object of this invention to provide a method and a tool for imprinting a holographic pattern in aluminum foil.

It is a further object of this invention to provide an embossing roller having a single-piece holographic surface without clamps or seams.

These, and other objects of the invention as explained herein, are accomplished by anisotropically etching a hologram relief pattern into a durable surface to create an embossing tool. A hard substrate is coated with a transfer layer, such as a photoresist. A holographic relief pattern is created in the transfer layer. The transfer layer is then etched with an anisotropic etch, such as ion etching. If the substrate is a roller, the etch is directed towards the axis of the roller, and thus transfers the relief pattern of the photoresist into the surface of the roller without significant degradation in the holographic pattern. The embossing tool is then used as a die to stamp holographic patterns in aluminum foil, translucent plastics and other materials. Large quantities of holograms can be made from a single die because high-quality steel, chrome, or the like is used as the die. The die has no seams or clamps, and thus provides cleaner holograms, with less waste of material. The die may also be a flat plate mounted on a substrate, an inside surface of an injection mold, a mandrel, a casting mold, or other surface used for transferring a relief pattern.

Various techniques and materials may be used for generating a relief pattern in the transfer layer overlaying the embossing tool. If the transfer layer is a photoresist, a hologram may be recorded in the photoresist by shining light through a mask; the photoresist is developed, and then the photoresist and metal substrate are anisotropically etched. In one embodiment, the transfer layer is a deformable layer formed onto the metal roller. A relief pattern is created in the transfer layer by pressing it against a harder surface having the desired relief pattern. The relief pattern in the transfer layer is transferred into the die by anisotropic reactive-ion etching. The relief pattern may also be formed as a rainbow hologram, a synthetic hologram, a 2D3D hologram or numerous other techniques for forming holograms as is known in the art.

DETAILED DESCRIPTION OF THE INVENTION

Figure 1A:
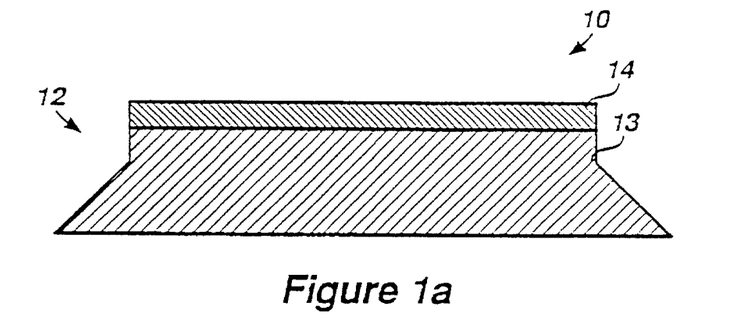
FIGS. 1a–1d are cross-sectional views of an embossing tool at various stages in the process of generating a holographic relief pattern in the tool.

As shown in FIG. 1a, an embossing tool 10 includes a substrate 12 and a smooth surface region 14 (the thickness of the surface region is enlarged for illustration purposes). In one embodiment, the substrate 12 is a hardened-steel block having a smooth surface region 14 formed in the steel by precision grinding and polishing. In an alternative embodiment, bright chrome is electroplated on the polished smooth surface of the hardened-steel block 12 to provide a chromium surface region 14. According to the principles of this invention, the surface region 14 is a hard surface to permit it to impress a holographic pattern formed therein, and repeatedly to be used to create holograms. The substrate 12 may be a block die 13, as shown in FIG. 1a–1d, or a roller 22, as illustrated in FIGS. 2–8.

Figure 1B:
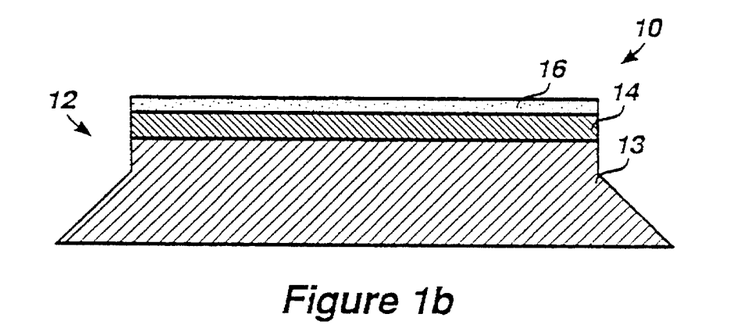

As shown in FIG. 1b, a transfer layer 16 is formed on top of the smooth surface region 14. The transfer layer 16 is comprised of a material in which a relief pattern may be easily formed by one of many methods. In one embodiment, the transfer layer 16 is a photoresist which adheres well to chrome or hardened steel. AZ 1350 positive photoresist is a suitable photoresist for use as transfer layer 16. Alternatively, the transfer layer 16 may be a malleable or deformable layer such as wax, plastic or other polymer, or other malleable material. A suitable transfer layer is selected based on a desired etch rate relative to the hardened surface region 14, as explained later herein.

Figure 3:
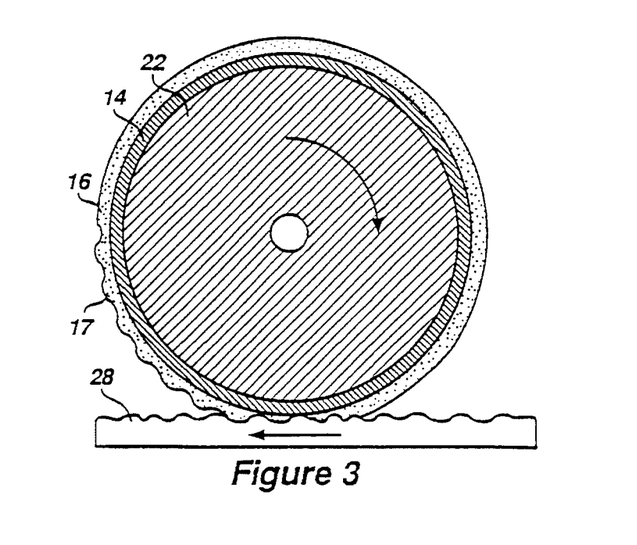
FIG. 3 is a cross-sectional view of a holographic relief pattern being formed in the transfer layer of an embossing tool by deforming the transfer layer under pressure.

For optimum results, the embossing tool 10 is prepared for receiving the surface-relief pattern as follows. The substrate 12 is ground to form a precisely smooth surface. If the substrate is a block die 13 as in FIGS. 1a–1d, the upper surface is precision ground and polished. If the substrate 12 is a roller 22, as shown in FIG. 3, the roller 22 is ground to a precise cylindrical surface or a crowned cylindrical surface. If slight depressions or elevations are in the upper surface 14 of the substrate 12, corresponding depressions or elevations in the final surface-relief pattern may exist, resulting in a lower-quality embossed final product.

The surface 14 of the substrate 12 is then polished to a uniformly flat, smooth surface. The transfer layer 16 may be applied directly to the polished surface region 14 of the substrate 12 if desired, the upper surface of the substrate 12 being the surface region 14. Alternatively, the surface of the substrate 12 is chrome plated, to remove all scratches and any surface roughness; the chromium being the surface region 14. Because of the likelihood that surface imperfections will be replicated in the embossing process, the final top surface 14, whether of chromium or hardened steel, is made as smooth and uniform as possible. The polished surface 14 is carefully cleaned to ensure good adhesion to the transfer layer 16. An adhesion promoter may be applied to the surface 14 if desired.

The transfer layer 16 is then applied. The transfer layer 16 should be uniform in thickness. A suitable method for applying the transfer layer 16 is drain coating, in which the substrate 12, whether a block 13 or a roller 22, is immersed in a tank of liquid photoresist. If the substrate 12 is a roller 22, it is immersed with the axis vertical in the tank of liquid transfer material. The liquid transfer material is then drained out of the tank such that the liquid surface descends at a slow, controlled and slightly decreasing rate, thereby depositing a uniform, striation-free film of transfer layer 16 on the surface 14 of the substrate 12. The viscosity and drain rate of the liquid are selected to provide a selected thickness of the transfer layer 16, generally on the order of 1–4 microns. Vacuum depositing a thin layer of ion oxide on the chromium surface 14 prior to applying the transfer layer 16 is helpful to reduce unwanted second-surface reflections in the event that optical methods are subsequently used to create the holographic pattern in the transfer layer. Other suitable techniques known in the microelectronics and printing arts for obtaining the prepared substrate 12 having the transfer layer 16 thereon may also be used.

Figure 1C:
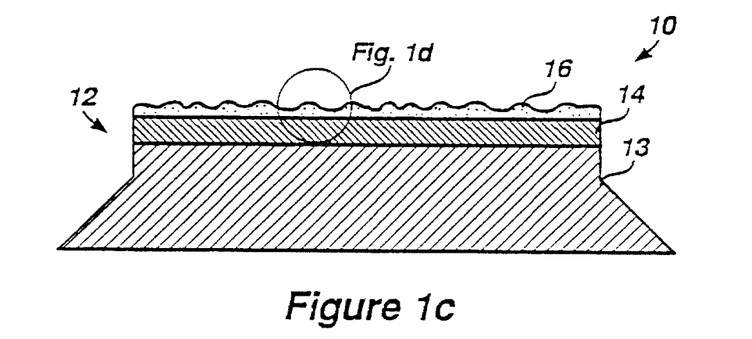

After the transfer layer 16 is formed on the surface 14 of the substrate 12, a holographic pattern is formed in the surface of the transfer layer 16. Various techniques and methods are used for forming the holographic relief pattern in the transfer layer 16, as will be discussed in more detail herein with respect to FIGS. 3–8. FIG. 1c illustrates the transfer layer 16 after the relief pattern 17 has been formed therein. The relief pattern 17 contains the appropriate grooves, undulations and the like to replicate a holographic pattern.

Figure 2:
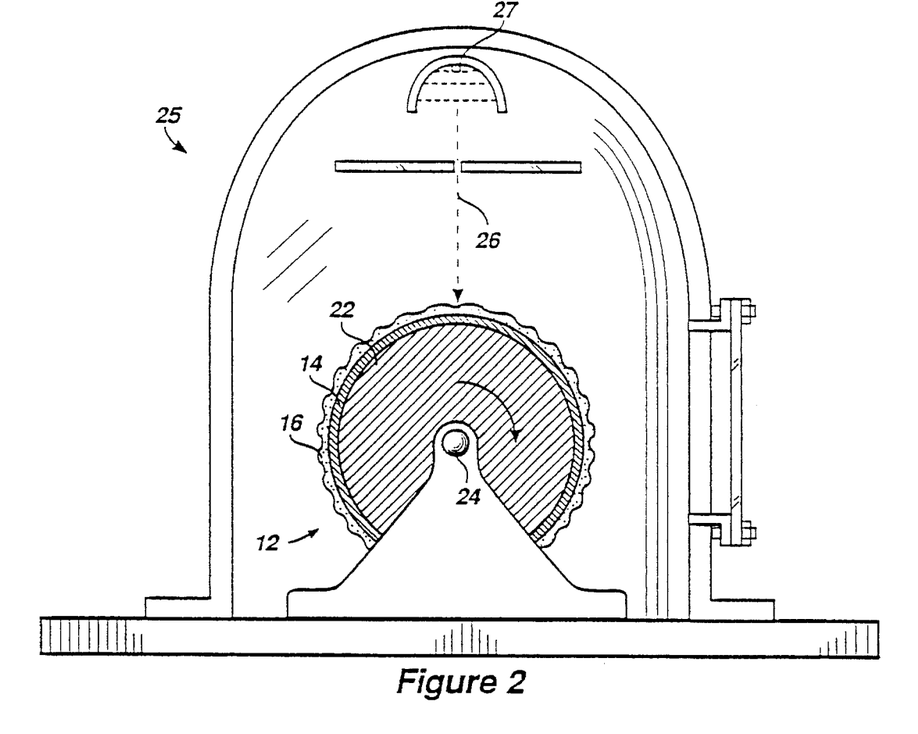
FIG. 2 is a cross-sectional view of a roller while being anisotropically ion etched.

The relief pattern 17 in the transfer layer 16 is transferred to the surface region 14 by an anisotropic etch. FIG. 2 illustrates an anisotropic etch being carried out on a hardened-steel roller 22 having a transfer layer 16 formed over a surface region 14. The roller 22 is mounted in an ion etching chamber 25 for rotation about its axis 24 and having the ion beam 26 approximately normal to the surface region 14. Anisotropic ion etching occurs along the direction of the ion beam 26 towards the axis 24. The beam intensity and etch time is preferably uniform over the entire surface 14 as the roller 22 rotates. The roller 22 is slowly rotated to uniformly subject the roller 22 to the ion beam 26. Anisotropic ion etching continues until the transfer layer 16 is entirely removed from the surface region 14 and the relief pattern 17 is transferred into the roller 22. The etch rate is slow enough that the transfer layer 16 and surface 14 are not distorted by heating.

The exact angle of incidence of the etch beam and the direction of etch on each point will continuously change because the cylinder is slowly rotating. A series of experiments has shown the surprising result that the precise direction of anisotropic etching is not of crucial importance when etching holographic relief patterns from the transfer layer 16 into the surface region 14. It was found that etching at an angle of 30° from normal to the surface for a selected time period, followed by an etch normal to the surface for the selected time period, and then followed by an etch at a 30° angle to the other side of normal to the surface for the selected time period did not noticeably alter the image. The variations in angle of incidence as the cylinder 22 rotates are acceptable in producing a high-quality relief pattern in the surface 14. In the prior art of ion etching, the etch rate and production of an anisotropic etch with respect to the surface have been restrictively dependent upon the slope of the etch beam with respect to the surface. However, in the present invention, the variation in the anisotropic etching rate is sufficiently small as the roller 22 rotates that the difference may be ignored for most image holographic purposes. The invention therefore provides the advantage that the roller 22 may be slowly rotated about its axis 24 while subjected to a relatively thin ion beam 26 to uniformly etch the entire surface 14 of the roller 22. If the substrate 12 is a block 13 as shown in FIG. 1c, the block is placed in the reactive-ion etching chamber for etching. The block 13 is slowly moved laterally with respect to the ion beam 26 to uniformly etch the surface region 14 or the beam 26 is moved, by sweeping it through an angle, moving the filament 27 laterally, or by magnetic or electrostatic steering. Alternatively, a broad ion beam may etch the entire surface simultaneously.

Figure 1D:
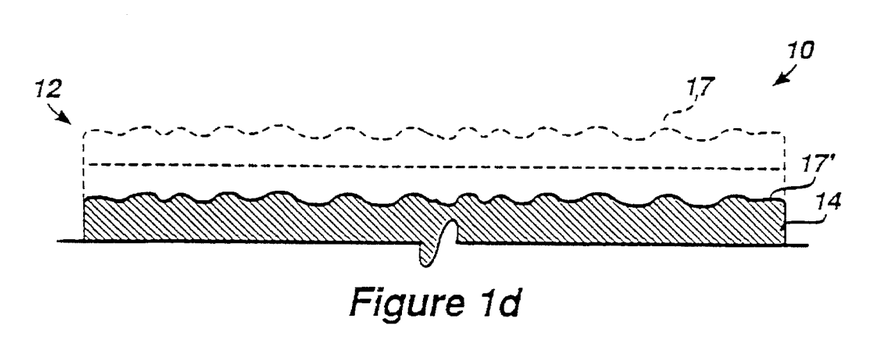

FIG. 1d is a cross-sectional surface of the surface region 14 having the relief pattern 17' therein after the reactive-ion etching. The transfer layer 16 has been completely etched away and the relief pattern 17 has been transferred to the surface region 14 as pattern 17'. The surface region 14 is a hard surface and may be used repeatedly for producing holographic relief patterns in many different materials.

The relief pattern 17' in the hard surface 14 almost exactly follows the relief pattern 17 of the transfer layer 16. As the transfer layer 16 is etched away, the relief pattern 17' is formed in the surface region 14. The depth of the individual features of the relief pattern 17' in the surface 14 relative to the pattern 17 formed in the transfer layer 16 is dependent upon the relative etch rates of the transfer layer 16 and the surface layer 14. In one embodiment, the etch rates of the transfer layer 16 and the surface region 14 are selected to be nearly identical, thus creating a relief pattern 17' that is nearly identical in dimensions to the relief pattern 17. If the etch rate of the surface 14 exceeds the etch rate of the transfer layer 16, the depth modulation of the relief pattern 17' is increased. In some circumstances, increasing the depth modulation of the relief pattern 17' from the transfer layer 16 into the surface region 14 is desired, so transfer layer 16 is selected to have a slower etch rate than the surface region 14, thus creating a pattern 17' with greater depth modulation than in the pattern 17 of the transfer layer 17. On the other hand, if the etch rate of the surface region 14 is less than the etch rate of the transfer layer 16, the depth modulation of the relief pattern 17' will be decreased. The etch rate of the transfer layer 16 relative to the surface region 14 is dependent upon the choice of material for the transfer layer 16, the type of surface region, whether hardened-steel, chrome, type of chrome or other alloy; the composition of the ions in the reactive-ion etch; ambient atmosphere of the etching process; post-development treatment of the photoresist; and the like. The full set of process parameters are selected to yield the desired relief profile in the final embossed product, such processing steps being known to those of skill in the art of ion milling and reactive ion etching.

The steps described herein have been carried out to form a holographic image and a final product according to the invention. A chrome-plated steel substrate 12 was coated with a 3-micron layer 16 of positive photoresist. A hologram was exposed into the photoresist 16 using a 457-nm wavelength argon laser. Development of the photoresist 16 after exposure for 10 seconds in photoresist developer diluted 5 to 1 created a relief pattern 17 having a depth modulation of approximately 0.1 micron and an overall photoresist thickness of approximately 1 micron. The substrate 12, having the developed photoresist 16, was placed in an ion etching chamber having argon gas therein. The photoresist 16 was etched in a low-pressure argon atmosphere for twenty minutes, completely removing the resist and transferring the relief pattern 17 into the surface 14. The holographic relief pattern 17' formed in the chromium surface was indistinguishable from the original relief pattern 17 recorded on the surface of the photoresist. The steel block substrate 12 having the relief hologram pattern 17' formed in the chromium surface region 14 was then used as a die for stamping brass coin replicas of the hologram.

The invention may be used to produce many types of forms or dies for transferring holograms from one surface to another. According to the invention, injection molds, dies, mandrels, continuous casting molds, flat embossing dies, hot stamping dies, coin stamping dies, electroforming dies, electroless plating mandrels and the like may be formed. In summary, the invention provides a method for making a master embossing tool or die for replicating a microscopic relief pattern in numerous materials. The tool need not be in block die or cylindrical roller. For example, the tool may be a flat plate, a sphere, a cone, or even an irregular surface shape, depending on the desired application of the hologram to a final embossed product. The pattern 17 need not be a hologram. A tool created by this method may be used as an embossing master for non-holographic products such as microfilm, optical floppy disks, noninterferometrically generated diffractive patterns, or the like. For a non-holographic product, the relief pattern 17 may be exposed into the transfer layer 16 by an electron beam, focused laser beam, or the like.

Use of an extremely hard material for surface 14, such as chromium or steel, with the relief pattern 17' formed therein permits holographic images to be formed in materials in which it was not previously possible to provide such images. For example, a holographic pattern may be embossed into aluminum foil, aluminum sheets, steel beverage containers, or the like. High temperature molds may include a holographic pattern because the range of materials for use as the substrate 12 is significantly increased. In addition, calendar rollers, security printing plates, metal stamping dies, optical compact disks, preformatted optical recording media, diffractively decorated electroform metal parts, injection molds, microlithographic patterns for electronics, and holographic solar concentrators may be formed using a die constructed using the principles of this invention.

Rollers 22 made according to this invention are particularly well suited to use in the continuous-casting production of holograms described in previous U.S. patents. See, for example, U.S. Pat. Nos. 4,758,296 and 4,906,315 to McGrew, the inventor of the present invention. Continuous casting of relief holograms is carried out by impressing the hologram into a thin film of radiation-curable resin. The value of the invention in producing such holograms is in the high fidelity attainable and in the seamless nature of the roller 22 which is produced. Numerous problems have been experienced in the industry when a seam or rough spot on the roller 22 is present. The seam or rough place may tend to build up a deposit of partially cured resin, significantly degrading the quality of the holograms and the number of holograms which may be produced from a single thin film. The roller 22, having the pattern embossed in its surface region 14, creates significantly higher quality holograms and in much greater quantities than previously possible because there are no seams in the roller for holographic die attachment and clamps are not required.

Any suitable anisotropic etching process may be used for etching the relief pattern from the transfer layer 16 into the surface region 14. An anisotropic etching process is one which is generally a single direction etching process because it etches significantly faster in one direction than in another. The directionality may be a function of the ion beam direction, electromagnetic field direction, surface geometry, and other factors as is known in the art. Electron beam etching, laser beam etching, reactive-ion etching, ion milling, and in some instances chemical etching, may be used in the anisotropic etching steps of this invention.

The substrate may be any suitable material, depending upon the application. In some embodiments, the substrate is preferably a metal such as chromium or hardened steel; however, in other embodiments, material such as diamond, ceramic, glass, plastics, or Teflon® may be preferred. Each particular application for a relief hologram die or roller may have an optimum substrate material. For example, in applications where the embossing pressure is low, use of a low-stick material such as Teflon® may be advantageous. In high-temperature, low-impact applications, a material such as quartz is preferred. In high-speed, high-pressure applications such as foil rolling, a chrome-plated hardened-steel roller is preferred.

FIGS. 3–8 illustrate different methods of forming a relief pattern in the transfer layer 16. The surface-relief pattern 17 in the transfer layer 16 should be formed in such a way that the upper surface of the region 14 remains covered everywhere with at least a thin layer of transfer material 16. If the transfer layer 16 is excessively deformed or, in the case of a photoresist, excessively developed or exposed, the surface region 14 may be revealed. The relief pattern 17' will be "clipped" in the locations where the layer 14 is revealed and consequently, the relief pattern 17' will not accurately represent the desired holographic pattern 17. Of course, in some cases "clipping" may be desirable, e.g., to form a square wave diffraction pattern. Preferably, in holographic imagery applications the relief pattern 17, prior to the directional etching, should be undistorted by the surface 14 directly below the transfer layer 16.

In the embodiment of FIG. 3, the transfer layer 16 is a deformable surface, such as a wax or plastic. The roller 22 is pressed against a master relief surface 28 to impress the relief pattern into the deformable material 16. The master embossing surface 28 may be a hardened gelatin, a polymerized photoresist, a nickel plate created by known prior art methods, or the like. The substrate 12 may be pressed against the surface 28 if it is a block 13 rather than a roller 22.

Figure 4:
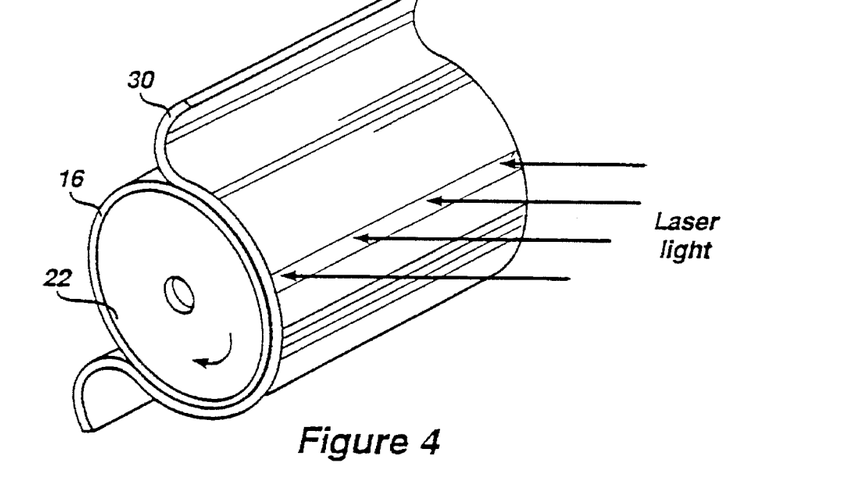
FIG. 4 is an isometric view of a holographic pattern being exposed in a photoresist on a roller.

FIG. 4 illustrates an alternative method for forming a relief pattern 17 on the transfer layer 16. The transfer layer 16 is a photoresist which may be developed after being exposed to laser light. A transparent film 30 having a master hologram formed therein is wrapped around roller 22. The roller 22 is slowly rotated while a beam of laser light impinges thereon through the master holographic film 30, contact printing an image in the photoresist 16. A relief pattern 17 corresponding to the hologram is formed by developing the photoresist 16. The roller 22 is then placed in the ion etching chamber 25 of FIG. 2 to produce the seamless relief pattern 17' in roller 22, as previously described.

Figure 5A:
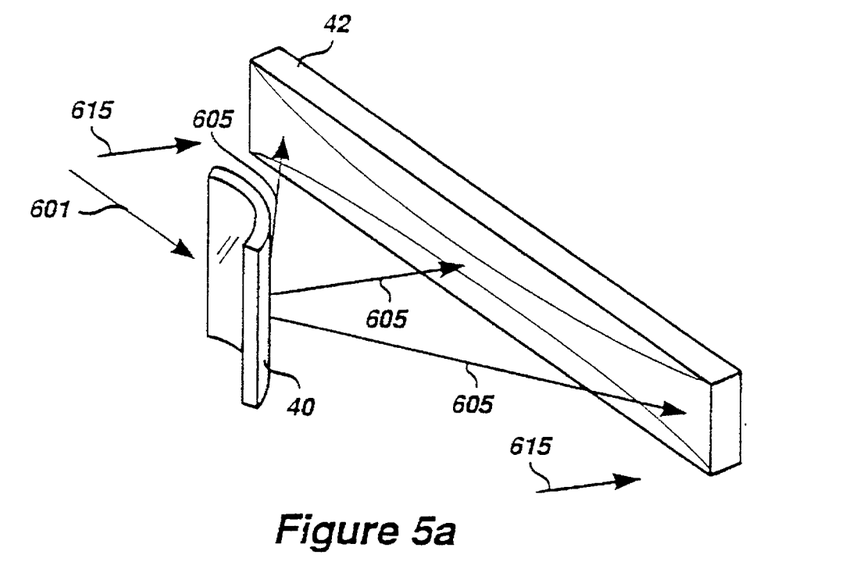
FIGS. 5a–5b are isometric views of an alternative method of transferring a holographic pattern to a transfer layer on a roller.
Figure 5B:
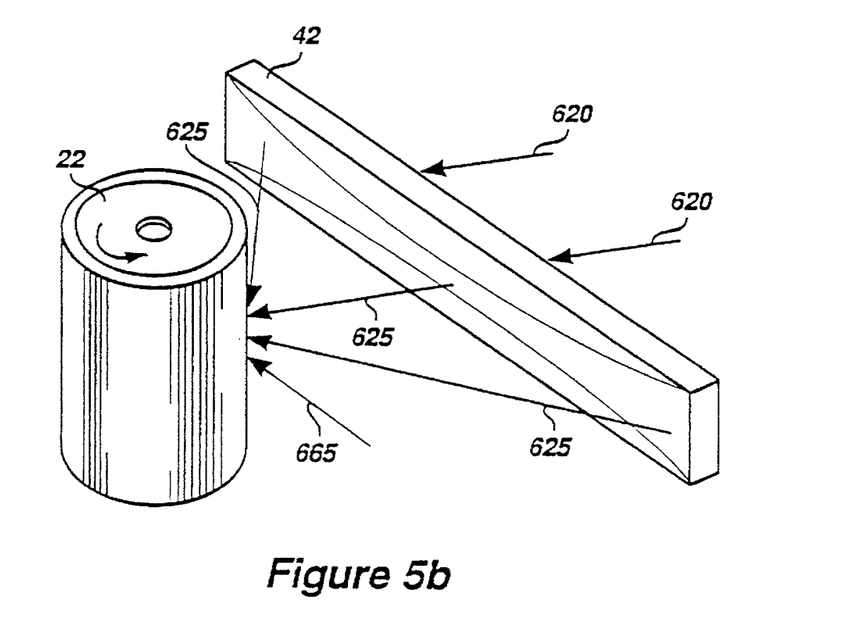

FIGS. 5a and 5b illustrate an alternative method for exposing the transfer layer 16 to the holographic pattern. To faithfully reproduce a flat hologram from a roller 22, a flat holographic master film 40 and roller 22 are preferably in the proper relative relationships when creating a relief pattern 17. That is, the object and reference beams used to record the hologram on the roller 22 are cylindrically transformed versions of the object beam and reference beam used to record the equivalent flat hologram. If the hologram is relatively small, that is, the hologram covers less than about 45° of the roller's arc, then the method illustrated in FIGS. 5a and 5b is practical.

According to the method of FIGS. 5a and 5b, the flat film 40 having the hologram therein is produced using known techniques for creating holographic images. The film 40 is flexible. The film is bent into the same shape and curvature as the surface of the roller 22. As shown in FIG. 5a, the curved film 40 is illuminated with coherent light using a collimated or other easily reproduced beam 601 to form a reconstructed beam 605 for recording on flat holographic film 42. A reference beam 615, which may be collimated or may have any other easily reproducible configuration, is also used to record the hologram on the film 42.

As shown in FIG. 5b, the holographic image is transferred to the layer 16 on roller 22 from the flat film 42. The flat film 42 is illuminated with the beam 620, which is the conjugate of the reference beam 615, to form the conjugate 625 of the object beam 605. The photoresist coated roller 22 is positioned so that the reconstructed real image of the original hologram on film 40 of FIG. 5a is substantially coincident with the surface of the roller 22. A reference beam 665, which is a conjugate of the reference beam 601 of FIG. 5a, exposes the photoresist on the roller 22 at the same time as the real image 625 is being formed therein, creating the holographic pattern 17 on the photoresist. The holographic pattern 17 is then transferred to the surface of the roller using the techniques previously described herein. Because the beams used to form the holographic pattern on the photoresist are conjugates of the illuminating and reconstructed beams in 5a, the hologram formed in FIG. 5b is essentially identical to the hologram on film 40 of FIG. 5a. Consequently, embossed replicas on flat sheets of the relief pattern 17' formed on roller 22 in FIG. 5b will be accurate replicas of the hologram in film 40 of FIG. 5a. If multiple copies of a hologram are desired on a single roller 22, the pattern is stepped and repeated around the roller 22 parallel to its axis as desired.

Other techniques for forming a holographic image in a photoresist as practiced in the prior art may also be used. Exposing photoresist to holographic images per se is known in the prior art, and such techniques may also be used if applicable to the shape of the tool 10. For example, a flat "rainbow" hologram may be illuminated with collimated monochromatic light. As is known, a "rainbow" holographic pattern focuses the light to a horizontal strip corresponding to the optimum viewing position. When the hologram is rolled into a cylinder corresponding to the shape of the embossing roller 22 that is formed, the collimated illumination is transformed to illumination which diverges from the axis of the roller 22. The horizontal strip is not transformed into a simple circle, as might be expected, but rather into a diffused disk.

Figure 6:
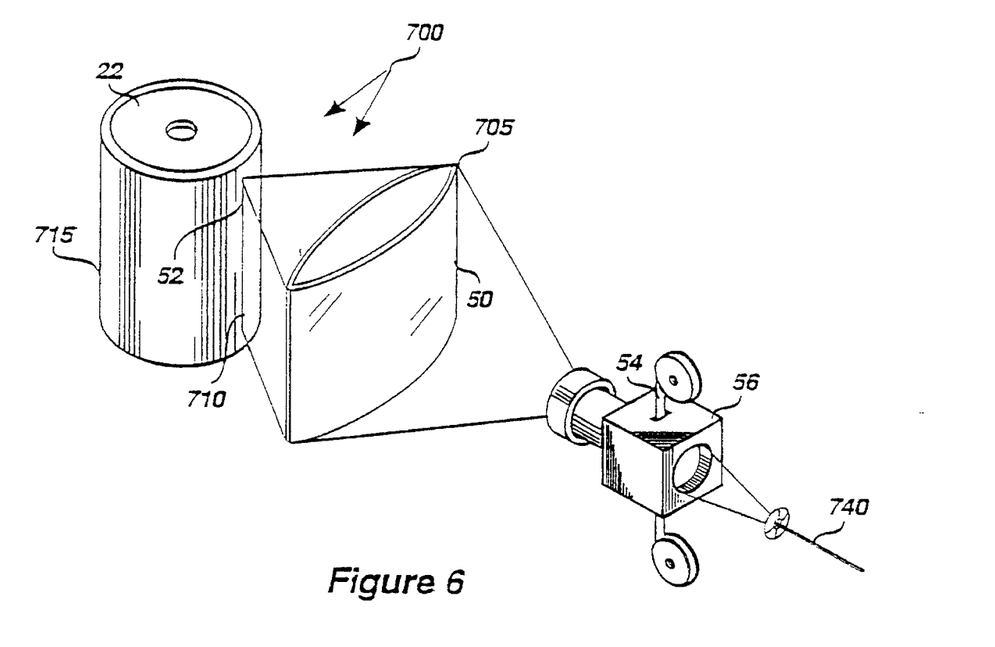
FIG. 6 is an isometric view of an alternative method for forming the holographic relief pattern in the transfer layer of the embossing tool.

FIG. 6 illustrates an alternative method for forming a holographic image in a photoresist on roller 22. A lens 50 which focuses light to a thin vertical strip 52 is illuminated with laser light 740, passing through film 54 having photographic images thereon. The frames of the film 54 advance sequentially through the projector 56, as roller 22 is advanced in steps, and thus the frames are recorded as adjacent, parallel, vertical strips 710 where reference beam 700 and beam 740 overlap. The roller 22 may be held stationary for each exposure. If pulsed laser light 740 is used, roller 22 may be slowly rotated. This method for synthesizing a holographic image from film 54 is generally known in the prior art of holography as a Cross-type hologram. Sometimes a Cross-type hologram is referred to as a multiplex hologram, integral hologram, or a composite hologram, as described in U.S. Pat. No. 3,206,965, incorporated herein by reference.

Figure 7:
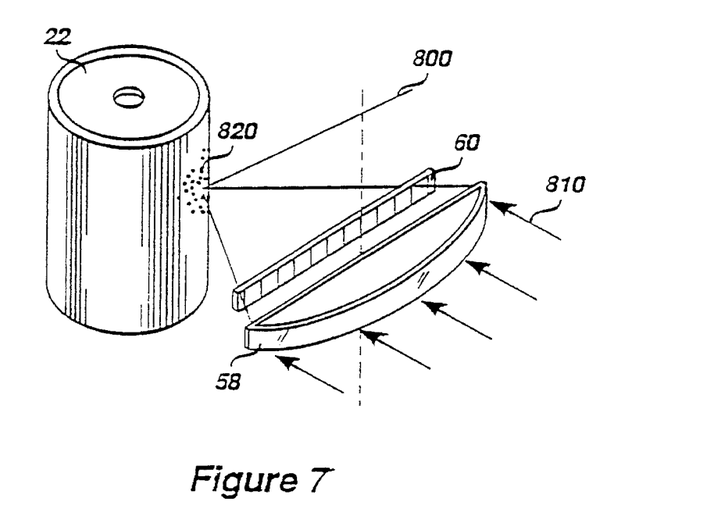
FIG. 7 is an isometric view of a further alternative method of forming a holographic relief pattern in the transfer layer of an embossing tool.

FIG. 7 illustrates forming a hologram in a photoresist layer on roller 22 point by point as described in a co-pending patent application titled "Holocomposer," filed simultaneously herewith and incorporated herein by reference. Light 810 is passed through the appropriate lens 58 and through spatial modulator 60, having an image therein corresponding to a single raster line from a video frame. A reference beam 800 simultaneously exposes the photoresist, forming an interference pattern at point 820. A plurality of points 820 are sequentially recorded to form a hologram on the cylinder.

Figure 8:
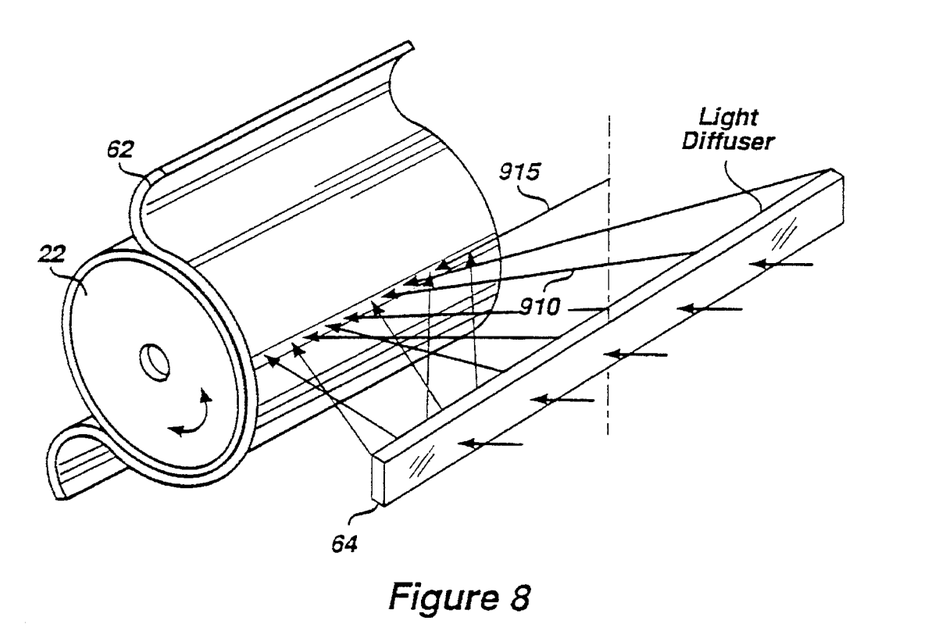
FIG. 8 is an isometric view of a further alternative method of forming a relief pattern in the transfer layer of an embossing tool.

FIG. 8 illustrates a method for forming a "2D3D" hologram on the roller 22. U.S. Pat. Nos. 4,629,282 and 4,717,221, incorporated herein by reference, describe a general technique for forming 2D3D holograms. To form a 2D3D hologram in a roller 22, a contact mask 62 is wrapped around the roller 22 for each of the several exposures. An object beam 910 consisting of light primarily random in one dimension is directed from a diffuser 64 onto the mask 62, along with a reference beam 915. Preferably, the diffuser 64 is a holographic diffuser, a lenticular screen, or a one-way diffuser for maximum light efficiency. The photoresist is exposed through the mask so that the exposure occurs only where the mask is transparent. For subsequent exposures corresponding to different colors and components of the image being formed, a new mask 62 having a different transparent pattern therein is provided and the angle of the object or reference beam is varied to change the color that will be viewed in the final hologram in each component as described in the incorporated patents. In order to expose the 3D component of the 2D3D hologram, the method previously described with respect to FIG. 4 may be used in which a film 30 having a master hologram therein is wrapped around the roller 22. It is not necessary that the mask 62 be wrapped entirely around the cylinder in the method of FIG. 8 and a step-and-repeat method for producing the image around the cylinder may be used.

Numerous methods of producing a hard, seamless surface having a holographic relief pattern therein have been described herein. Alternative embodiments for producing the relief pattern have been provided herein, including preferred embodiments. Variations of the principles taught herein will be apparent to those of ordinary skill in the art and fall within the scope of this invention. Many different types of tools and methods of providing holographic relief patterns and such tools may be made following the principles taught herein. All of these fall within the scope of this invention. Any equivalent device or method, though not identical to those disclosed and claimed herein falls within the scope of this invention.

I claim:

1. A method of making a tool for embossing holograms comprising:

providing a durable substrate having a smooth surface;

forming a transfer layer overlying the surface of the substrate;

forming a surface relief pattern in the surface of the transfer layer that corresponds to a holographic image;

etching said transfer layer and said substrate anisotropically using a beam-based etching process in a manner that causes the direction of said anisotropic etch on each point being etched to vary continuously during said etching; and continuing said etching until said surface relief pattern of the hologram has been etched from said transfer layer into said substrate.

2. The method according to claim 1 wherein said etching step includes:

etching across a selected area such that the etch direction varies across the selected area on the tool; and moving said substrate during said etching step to vary the portion of the substrate that is within the selected area.

3. The method according to claim 2 wherein said tool is a cylindrical roller and the moving step includes:

rotating the cylindrical roller about an axis that is normal to the direction of the etch.

4. The method according to claim 1 wherein said etching anisotropically is carried out with a reactive ion beam etch.

5. The method according to claim 1 wherein said etching anisotropically is carried out with an electron beam etch.

6. The method according to claim 1 wherein said etching anisotropically is carried out with a laser beam etching.

7. The method according to claim 1 in which the tool is a flat embossing die.

8. The method according to claim 1 in which the tool is formed from a hardened steel.

9. A method of making an embossing substrate for embossing holograms comprising:

providing a substrate having a smooth surface;

forming a transfer layer overlying the surface of the substrate;

forming a surface relief pattern corresponding to a holographic image in the surface of the transfer layer;

anisotropically etching over a selected surface area with an anisotropic etch beam-based etching process said transfer layer and said substrate while simultaneously moving said substrate through a range of motion that causes the angle of incidence of the etch beam and the direction of the etch to continuously change while the transfer layer and substrate are being etched; and continuing said anisotropic etching until said holographic image pattern in said transfer layer has been etched into said substrate.

10. The method according to claim 9 wherein said substrate is a cylindrical roller and said moving of said substrate includes:

rotating the cylindrical roller about an axis that is normal to the direction of the anisotropic etch.

11. The method according to claim 10 in which the selected surface area is of a selected size and shape such that the angle of incidence varies from a positive angle from the normal etch and by a negative angle from the normal etch over the selected area during the rotation of the cylindrical roller.

12. A method of making an embossing substrate for embossing holograms comprising:

providing a substrate having a smooth surface;

forming a transfer layer overlaying the surface of the substrate;

forming a surface relief pattern corresponding to a holographic image in the surface of the transfer layer;

anisotropically etching the transfer layer and the surface of the substrate with a relatively thin ion beam while simultaneously moving said substrate and said relatively thin ion beam relative to each other to cause the angle of incidence of the etch beam and the direction of the etch on each point to change continuously while the transfer layer and substrate are being etched; and continuing said anisotropic etching until said holographic image pattern in said transfer layer has been etched into said substrate.

13. The method according to claim 12 in which said embossing substrate is a cylindrical roller and said anisotropically etching step includes the step of:

rotating the roller slowly about its longitudinal axis while subjecting it to an anisotropic etch of the relatively thin ion beam to uniformly etch the entire surface of the roller, the angle of incidence of the etch beam and the direction of etch on each point continuously changing because the roller is slowly rotating.

14. The method according to claim 12 in which the embossing substrate is a block die and wherein said anisotropically etching step includes the step of moving the block die slowly laterally with respect to the relatively thin ion beam to cause the angle of incidence of the etch beam to change during etching of the exposed surface region of the transfer layer and the substrate.

15. The method according to claim 12 in which said substrate is a block die and said anisotropically etching step includes the step of:

moving the relatively thin ion beam, by sweeping it through an angle while performing said anisotropically etching step to cause the angle of incidence of the etch beam and the direction of etch on each point to continuously change because the relatively thin ion beam is sweeping through an angle during said anisotropically etching step.

* * * * *